United States Patent [19] [11] 3,871,931
Godber [45] Mar. 18, 1975

[54] METHOD FOR SELECTIVELY ETCHING SILICON NITRIDE

[75] Inventor: Geoffrey Allan Godber, Roade, Northampton, England

[73] Assignee: Plessey Incorporated, New York, N.Y.

[22] Filed: Jan. 17, 1974

[21] Appl. No.: 434,109

[30] Foreign Application Priority Data
July 18, 1973 United Kingdom ............. 34213/73

[52] U.S. Cl. ............................ 156/7, 156/2, 156/8, 156/17, 252/79.2
[51] Int. Cl. ............................................ C23g 1/00
[58] Field of Search ............... 252/79.2; 156/2, 7, 8, 156/17; 148/187

[56] References Cited

UNITED STATES PATENTS

| | | | |
|---|---|---|---|
| 3,671,437 | 6/1972 | Pless | 252/79.3 |
| 3,706,612 | 12/1972 | Palmer | 156/17 |
| 3,709,749 | 1/1973 | Sato et al. | 156/11 |
| 3,759,768 | 9/1973 | Lawrence | 156/17 |

*Primary Examiner*—William A. Powell
*Attorney, Agent, or Firm*—James J. Burke

[57] ABSTRACT

Etching of silicon nitride with a hot solution of arsenic acid is faster than the conventionally-employed phosphoric acid, and has the additional advantage of not attacking either silicon dioxide or heavily doped silicon. The invention is useful in the fabrication of silicon integrated circuits and in the surface treatment of silicon nitride bodies, i. e. chemical milling.

9 Claims, No Drawings

METHOD FOR SELECTIVELY ETCHING SILICON NITRIDE

BACKGROUND OF THE INVENTION

The present invention relates to a method of selectively etching silicon nitride.

Silicon nitride has shown itself to be a highly useful material in the semiconductor industry but has fallen short of its full potential due to lack of a good etch. Fabricated parts of silicon nitride are useful in high temperature applications such as blades in turbines, but achieving a precise surface finish or configuration is very difficult.

There are in common use today two etches for silicon nitride, (1) Hydrofluoric acid, (2) O. phosphoric acid. Hydrofluoric acid is generally used in conjunction with a metal mask, but has a much higher silicon dioxide etch rate than it does for silicon nitride, which tends to limit its usefulness in complex integrated circuit production.

O. phosphoric acid used at temperatures above 100°C has a higher silicon nitride etch rate, but conventional photo resists cannot withstand these temperatures and still retain the necessary definition. To overcome this, a layer of silicon dioxide is deposited from the vapor phase, which when photoengraved in the usual manner acts as an etch mask against the phosphoric acid. This is of course a cumbersome and time consuming procedure.

Both of these etches for silicon nitride will etch silicon and preferential etching of highly doped 'P' and 'N' type silicon has been noticed which can lead to problems in transistor production.

Water hydrolysis of the silicon nitride has been suggested as a mechanism for the etching but it is believed that another mechanism, involving the formation of a complex phosphor silicate molecule, may be involved.

OBJECTS OF THE INVENTION

A general object of the present invention is to provide an improved method of etching silicon nitride.

Another object of the present invention is to provide a method of etching silicon nitride which is more selective and faster than etching with known etchants.

Various other objects and advantages of the invention will become clear from the following description of embodiments thereof, and the novel features will be particularly pointed out in connection with the appended claims.

DESCRIPTION OF EMBODIMENTS

The present invention provides a method of selectively etching silicon nitride which includes the steps of providing an etch solution of arsenic acid; heating the etch solution to an elevated temperature; and exposing selected areas of the silicon nitride to the heated etch solution, the unselected areas of the silicon nitride being protected by an etch resistant mask. Derivatives of arsenic $\underline{V}$ compounds, or an oxidizing species not of that group, can be added to the arsenic acid in order to stabilize the etch solution. Preferably the temperature of the etch solution is approximately 140°C. The etch resistant mask can be of a commercially available photo resist or silicon dioxide formed by vapor phase deposition but, for reasons of simplicity and economy, a photo resist mask is preferred.

The foregoing and other features according to the invention will be better understood from the following description of specific embodiments of the invention.

The method according to the invention for selectively etching silicon nitride includes the steps of providing an etch solution of arsenic acid and heating this etch solution to an elevated temperature, for example approximately 140°C., in a refluxed system.

Derivatives of arsenic $\underline{V}$ compounds, or an oxidizing species not of that group can be added to the arsenic acid in order to stabilize the etch solution.

Selected areas of the silicon nitride are then exposed to the heated etch solution, the unselected areas of the silicon nitride being protected by an etch resistant mask.

Silicon dioxide and some commercially available photo resists are resistant to the arsenic acid etch solutions, therefore, the etch resistant mask can be made from either of these materials. It is, however, preferable to use a photo resist mask because its formation is much simpler than a silicon dioxide mask which is generally formed by vapor phase deposition. The use of a photo resist mask to protect the silicon nitride thus results in the most economical method. Some conventional photo resists that are unsuitable at the temperature needed for $H_3PO_4$ etching are stable in the present process.

It has been found that arsenic acid (75%) at a temperature of 140°C. will etch silicon nitride at a rate of 45A/min. but will not etch silicon dioxide or highly doped p-type and n-type silicon. In these respects, it is superior to O. phosphoric acid. The silicon nitride was in the form of a 1000A thick amorphous film grown by a vapor phase deposition process from the reaction of silane and ammonia in the ratio of 1:100 in an argon carrier gas at a temperature of 850°C. The silicon dioxide was in the form of a 1000A thick undensified film grown by a vapor phase deposition process for the reaction of silane and oxygen at a temperature of 400°C.

It has also been found that no change in etch rate occurred for additions of arsenic pentoxide to the arsenic acid, as the acid at 75% is a saturated solution.

The etching method according to the invention is, therefore, ideally suited for use in the production of semiconductor devices, for example integrated circuits, where silicon nitride is used.

Silicon, as previously stated, is resistant to the arsenic acid etch solutions, therefore, the etching method according to the invention can be used in the production of silicon integrated circuits or devices.

Understanding of the invention will be further facilitated by referring to the folowing specific examples thereof, wherein etchant properties of phosphoric and arsenic acids are compared.

EXAMPLES

Films of 1000A of silicon nitride and silicon dioxide were prepared as noted above.

Quantitative and qualitative analysis of the films throughout the experiment was carried out by means of a helium/neon elipsometer. Etching of diffused silicon surfaces was seen as changes in sheet resistivity as this was considered to be the most sensitive means of monitoring changes. All etching took place in a reflux cell held at a pre-specified temperature throughout the experiment. Results are set forth hereinbelow in Table I.

Table I

| | O. phosphoric acid (85%) | Arsenic acid (75%) |
|---|---|---|
| Temperature | 150°C. | 140°C. (Boiling) |
| $Si_3N_4$ etch rate | 38A/min. | 45A/min. |
| $SiO_2$ undensified etch rate | 10A/min. | No change |
| Si heavily doped 'P' and 'N' etch rate | 5A/min. | No change |

In addition, it was noted that no change in etch rate occurred for addition of arsenic pentoxide to arsenic acid, as the acid at 75% is a saturated solution. While not wishing to be bound to any theory of operation, it is possible that the difference between the etch nature of arsenic acid and phosphoric acid is one of molecular size, which provides a general ability for both phosphorus and silicon to form poly acids while arsenic does not.

Various changes in the details, steps, materials and arrangement of parts, which have been herein described and illustrated in order to explain the nature of the invention, may be made by those skilled in the art within the principle and scope of the invention as defined in the appended claims.

What is claimed is:

1. A method of selectively etching silicon nitride comprising:

providing an etch solution of arsenic acid;

heating said etch solution to an elevated temperature; and exposing selected areas of said silicon nitride to the heated etch solution.

2. The method as claimed in claim 1, wherein said selected areas are defined by openings in an etch-resistant mask.

3. The method as claimed in claim 2, wherein said mask is a photo resist.

4. The method as claimed in claim 2, wherein said mask is silicon dioxide.

5. The method as claimed in claim 1, and additionally comprising adding a stabilizing arsenic compound to said etch solution prior to etching.

6. The method as claimed in claim 5, wherein said compound is arsenic pentoxide.

7. The method as claimed in claim 1, wherein said etch solution is heated to approximately 140°C.

8. In a method for the etching of silicon nitride by reaction thereof with a hot acid, the improvement comprising using hot arsenic acid.

9. The method as claimed in claim 8, wherein said arsenic acid is at about 140°C.

* * * * *